(12) United States Patent
Sonntag

(10) Patent No.: US 7,777,585 B1
(45) Date of Patent: Aug. 17, 2010

(54) PASSIVE TEMPERATURE COMPENSATION FOR AN OSCILLATOR

(75) Inventor: Jeffrey L. Sonntag, Portland, OR (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 12/145,647

(22) Filed: Jun. 25, 2008

(51) Int. Cl.
*H03L 1/02* (2006.01)

(52) U.S. Cl. .................. 331/176; 331/167; 331/36 C

(58) Field of Classification Search .......... 331/167, 331/176, 36 C
See application file for complete search history.

(56) References Cited

U.S. PATENT DOCUMENTS

| | | | |
|---|---|---|---|
| 5,170,136 A | 12/1992 | Yamakawa et al. | |
| 5,805,028 A * | 9/1998 | Kato | 331/116 R |
| 6,788,159 B2 | 9/2004 | Takahashi et al. | |
| 6,980,062 B2 | 12/2005 | Fujita | |
| 7,164,325 B2 | 1/2007 | Aparin et al. | |
| 7,283,008 B2 | 10/2007 | Fujita | |
| 7,332,975 B2 | 2/2008 | Marques | |
| 2007/0041144 A1 | 2/2007 | Szeto et al. | |
| 2009/0102568 A1* | 4/2009 | Lu et al. | 331/75 |

* cited by examiner

*Primary Examiner*—Robert Pascal
*Assistant Examiner*—James E Goodley
(74) *Attorney, Agent, or Firm*—Zagorin O'Brien Graham LLP

(57) ABSTRACT

A technique for reducing temperature sensitivity of an LC oscillator circuit includes a passive circuit coupled in parallel with a load capacitor. In at least one embodiment, an oscillator circuit is configured to generate a periodic signal having a free-running frequency. The oscillator circuit includes a first circuit portion including at least one inductor coupled in parallel with at least one load capacitor. The first circuit portion has an inductance-capacitance product that has a first temperature sensitivity. The oscillator circuit includes a passive circuit portion coupled in parallel with the first circuit portion. The passive circuit portion includes at least one resistor in series with at least one capacitor. The passive circuit portion has a second temperature sensitivity that opposes an effect of the first temperature sensitivity on the free-running frequency of the oscillator circuit, thereby reducing temperature sensitivity of the free-running frequency.

28 Claims, 5 Drawing Sheets

PASSIVE TEMPERATURE COMPENSATION FOR AN OSCILLATOR

BACKGROUND

1. Field of the Invention

This invention relates to integrated circuits and more particularly to integrated circuits including oscillator circuits.

2. Description of the Related Art

One or more integrated circuit elements of an oscillator circuit may have properties that vary as a function of temperature. However, an application using an output signal generated by the oscillator circuit will require the output signal to have a frequency that is independent of temperature.

SUMMARY

A technique for reducing temperature sensitivity of an LC oscillator circuit includes a passive circuit coupled in parallel with a load capacitor of an LC circuit. In at least one embodiment of the invention, an oscillator circuit is configured to generate a periodic signal having a free-running frequency. The oscillator circuit includes a first circuit portion including at least one inductor coupled in parallel with at least one load capacitor. The first circuit portion has an inductance-capacitance product that has a first temperature sensitivity. The oscillator circuit includes a passive circuit portion coupled in parallel with the first circuit portion. The passive circuit portion includes at least one resistor in series with at least one capacitor. The passive circuit portion has a second temperature sensitivity that opposes an effect of the first temperature sensitivity on the free-running frequency of the oscillator circuit, thereby reducing temperature sensitivity of the free-running frequency.

In at least one embodiment of the invention, a method for generating a periodic signal having a free-running frequency includes passively opposing a first temperature sensitivity of an inductance-capacitance product of an oscillator circuit including at least one inductor coupled in parallel with at least one load capacitor, thereby reducing temperature sensitivity of the free-running frequency of the oscillator circuit. The passively opposing is performed by a passive circuit portion including at least one resistor in series with at least one capacitor and having a second temperature sensitivity.

In at least one embodiment of the invention, a method of manufacturing an oscillator circuit configured to generate a periodic signal having a free-running frequency includes forming a first circuit portion including at least one inductor coupled in parallel with at least one load capacitor. The first circuit portion has an inductance-capacitance product that has a first temperature sensitivity. The method includes forming a passive circuit portion coupled in parallel with the first circuit portion. The passive circuit portion includes at least one resistor in series with at least one capacitor. The passive circuit portion has a second temperature sensitivity that opposes an effect on the free-running frequency of the oscillator circuit, thereby reducing a temperature sensitivity of the free-running frequency.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
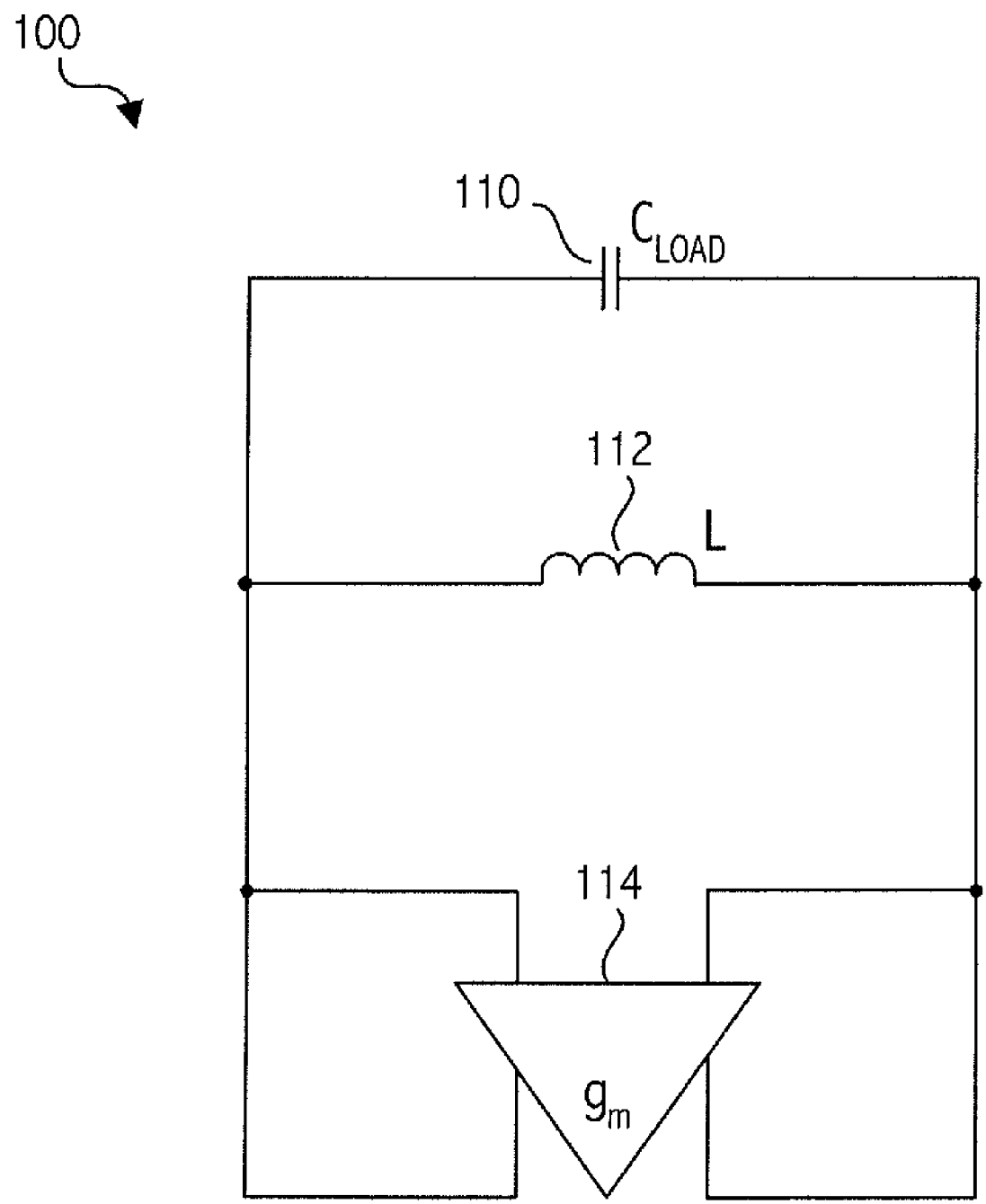
FIG. 1 illustrates a circuit diagram of an exemplary oscillator circuit.

Referring to FIG. 1, an exemplary LC oscillator circuit (i.e., tank circuit), has a free-running frequency (i.e., natural frequency or resonant frequency) in radians per second of $$\omega \approx \frac{1}{\sqrt{LC}}.$$

A typical integrated circuit inductor is formed from a material having a positive resistance temperature sensitivity, which may be characterized in parts per million per degree Celsius (i.e., ppm/° C.). The free-running frequency of oscillation of the oscillator circuit tends to have a negative temperature sensitivity as a result of changes to the effective inductance of the oscillator circuit and/or changes to the effective capacitance of the oscillator circuit, e.g., caused by temperature sensitivity of one or more parasitic resistance, temperature sensitivity of a conductor forming the inductor, temperature sensitivity of one or more parasitic diode, and/or temperature sensitivity of one or more gate capacitances, or other temperature-related effects. However, applications of the integrated circuit oscillator have a target operating frequency that is independent of temperature. Thus, analog or digital control systems may allocate substantial range to reducing the temperature sensitivity of the oscillator circuit.

The temperature sensitivity and/or compensation techniques may have detrimental effects on performance of the oscillator circuit, e.g., increase noise, increase power supply sensitivity, and in open loop applications, increase residual frequency error as compared to an LC oscillator with a smaller temperature sensitivity. Digital temperature compensation techniques typically use a digital thermometer. Digital thermometers are subject to aging, differential nonlinearity, and noise within the thermometer and may contribute an error in the compensated frequency that is inversely proportional to the temperature sensitivity of the uncompensated oscillator.

Figure 2:
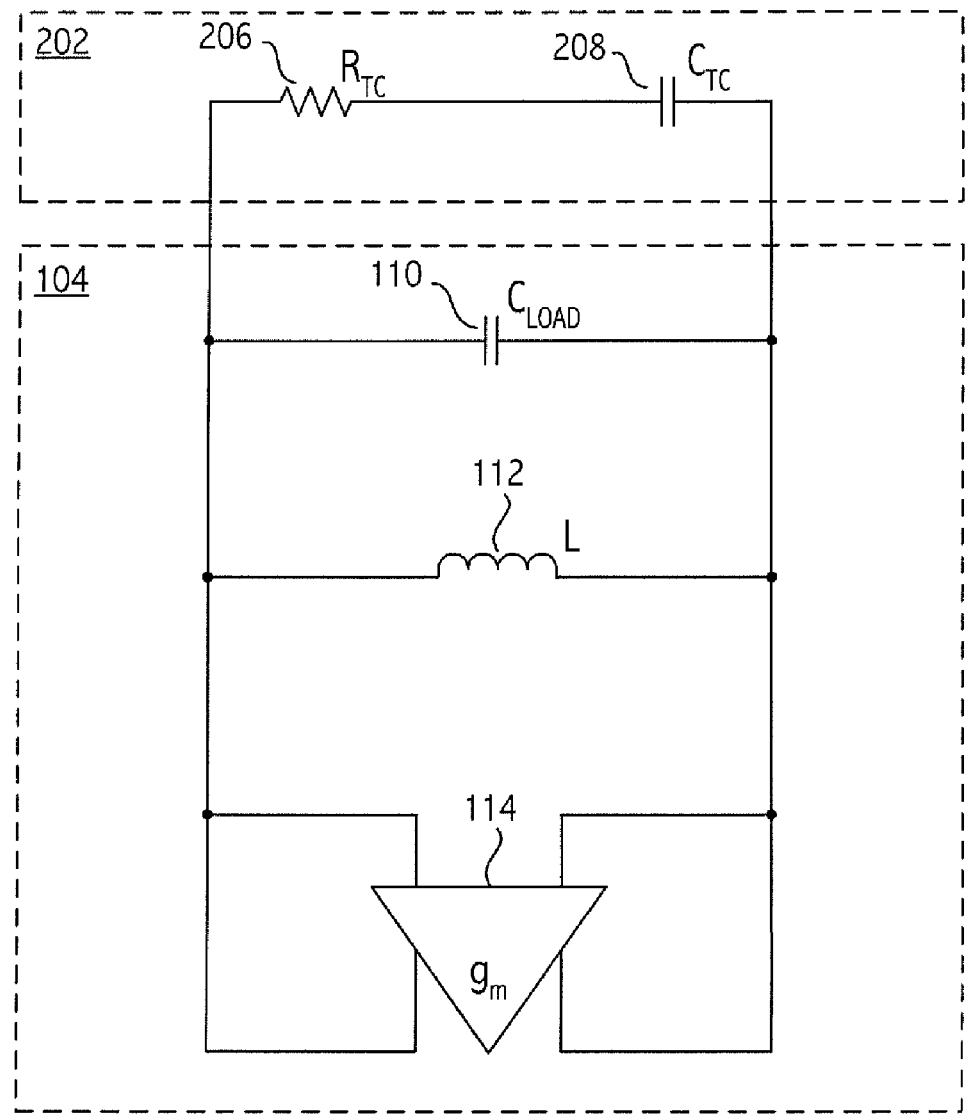
FIG. 2 illustrates a circuit diagram of an exemplary oscillator circuit consistent with at least one embodiment of the invention.

Referring to FIG. 2, exemplary integrated circuit oscillator circuit 200 includes a passive temperature compensation circuit (e.g., passive circuit 202) coupled in parallel with load capacitance 110 of the oscillator circuit. As referred to herein, a passive circuit is a circuit including no source of energy, i.e., a circuit including only elements that have no gain or control, e.g., resistor, inductor, capacitor. Passive circuit 202 has a temperature sensitivity that opposes the temperature sensitivity of inductor 112 and load capacitance 110.

In at least one embodiment, passive circuit 202 includes a temperature compensation resistor (e.g., resistor 206) and a temperature compensation capacitor (e.g., capacitor 208). The resistance of the temperature compensation resistor (e.g., $R_{TC}$) and the capacitance of the temperature compensation capacitor (e.g., $C_{TC}$) may be determined based on values of the inductance (e.g., L) and load capacitance (e.g., $C_{LOAD}$) of oscillator circuit portion 104. For example, a temperature compensation resistor and a temperature compensation capacitor may be chosen such that the product of the temperature compensation resistance and the temperature compensation capacitance may be approximately the square root of the product of the inductance and load capacitance of oscillator circuit portion 104, i.e., $$R_{TC} \times C_{TC} \approx \sqrt{LC_{LOAD}},$$

setting the phasor of the complex impedance to have an angle of 45° at the frequency of oscillation. Note that other phasor values may be used that trade off power dissipation and reduction in quality factor (i.e., Q) with an amount of temperature sensitivity. In at least one embodiment of passive circuit 202, the compensation capacitance may be substantially less than the load capacitance (i.e., $C_{TC} \ll C_{LOAD}$). Actual values of the passive circuit components that provide an appropriate temperature sensitivity and Q for a particular application of oscillator circuit 200 may be determined by integrated circuit simulation techniques. However, computational techniques may also be used to determine actual values of the temperature compensation resistance and the temperature compensation capacitance that provide appropriate levels of temperature compensation. Computational techniques may be used to determine an effective load capacitance associated with a particular passive circuit portion from an imaginary portion of complex conductivity of the passive circuit branch in parallel with the load capacitor of the oscillator circuit. The effect on overall temperature sensitivity and Q of the oscillator circuit can then be determined from the imaginary component of the complex conductivity of the combination of the passive circuit portion and the load capacitance.

For example, the complex conductivity of $C_{LOAD}$ in parallel with passive circuit 202 is $$\frac{1}{Z(s)}\bigg|_{s=j\omega} = sC_{LOAD} + \frac{sC_{TC}}{1 + sR_{TC}C_{TC}}\bigg|_{s=j\omega} = j\omega C_{LOAD} + \frac{j\omega C_{TC} + \omega^2 R_{TC}C_{TC}^2}{1 + \omega^2 R_{TC}^2 C_{TC}^2}.$$

The imaginary portion of the complex conductivity may be used to determine the effective capacitance of $C_{LOAD}$ in parallel with passive circuit 202:

$$C_{EFF} = \frac{\text{Imag}\left(\frac{1}{Z(j\omega)}\right)}{\omega} = C_{LOAD} + \frac{C_{TC}}{1 + \omega^2 R_{TC}^2 C_{TC}^2}.$$

The effective capacitance, i.e., $C_{EFF}$ of $C_{LOAD}$, in parallel with passive circuit 202, provides insight into the temperature sensitivity and quality factor (Q) of oscillator circuit 200. By defining $C_{TC} = \alpha C_{LOAD}$ where $\alpha \ll 1$ (e.g., $\alpha \approx 0.10$ or less) and is independent of temperature, and $R_{TC} C_{TC} = \eta/\omega$, where $\eta$ is not independent of temperature, the equation for the effective capacitance, i.e., $C_{EFF}$, is simplified:

$$C_{EFF} = C_{LOAD} \times \left(1 + \frac{\alpha}{1 + \eta^2}\right).$$

A relationship for the temperature sensitivity of the exemplary effective capacitance (i.e., $S(C_{EFF},T)$) may be determined as a function of the temperature sensitivity of the temperature compensation resistor (i.e., $S(R_{TC},T)$), which is typically positive for integrated circuit resistors:

$$S(C_{EEF}, T) = \frac{1}{C_{EFF}} \frac{\partial C_{EEF}}{\partial T} = -2\alpha \left(\frac{\eta}{1+\eta^2}\right)^2 S(R_{TC}, T).$$

Since $$\frac{\eta}{1+\eta^2}$$

has a maximum of ½ when $\eta=1$, choosing $\eta=1$ yields the following relationship:

$$S(C_{EEF}, T) = -\frac{\alpha}{2} S(R_{TC}, T).$$

Thus, a negative temperature sensitivity proportional to $\alpha$ is obtained. However, note that in other embodiments of oscillator circuit 200, other values for $\eta$ may be chosen, resulting in a reduction in the temperature sensitivity of $C_{EFF}$.

Although a particular temperature sensitivity may be obtained by choosing a particular value for $\alpha$, a large value of $\alpha$ impacts the Q associated with the $C_{EFF}$. The Q of an oscillator circuit is a dimensionless parameter that compares the frequency at which the system oscillates to the rate at which it dissipates energy. A higher Q indicates a lower rate of energy dissipation relative to the oscillation frequency. For example, the Q associated with the $C_{EFF}$ of oscillator circuit 200 is:

$$Q = \frac{\text{Imag}\left(\frac{1}{Z(j\omega)}\right)}{\text{Real}\left(\frac{1}{Z(j\omega)}\right)}\bigg|_{C_{TC}=\alpha C_{LOAD}, R_{TC}C_{TC}=\frac{1}{\omega}} =$$

$$\omega R_{TC} C_{LOAD}\left(1 + \frac{\alpha}{2}\right)(2) = \frac{2}{\alpha}\left(1 + \frac{\alpha}{2}\right) \sim \frac{2}{\alpha}.$$

Thus, the smaller values of α result in less power dissipation in the passive circuit and greater Q than higher values of α. In at least one embodiment of oscillator circuit 200, the Q associated with the $C_{EFF}$ of oscillator circuit 200 is at least approximately 40.

Figure 3:
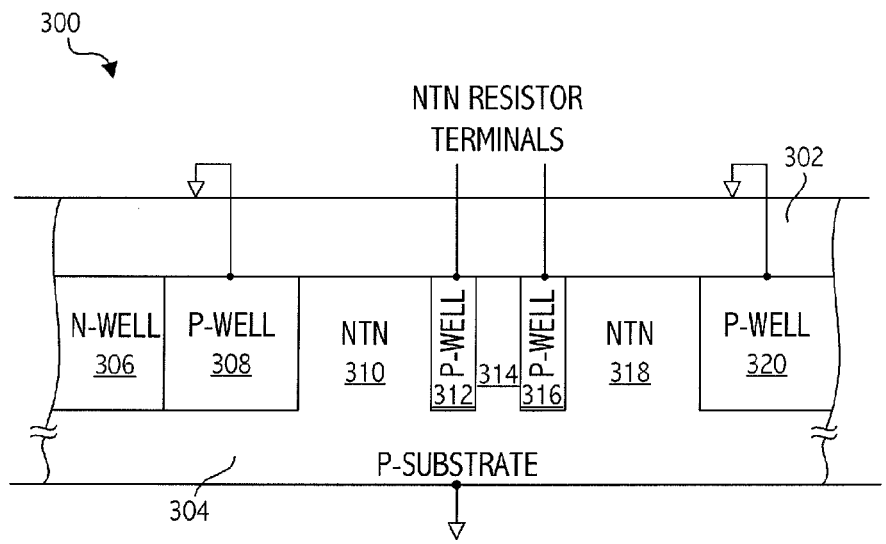
FIG. 3 illustrates a cross-sectional view of an exemplary integrated circuit resistor structure consistent with at least one embodiment of the invention.
Figure 4:
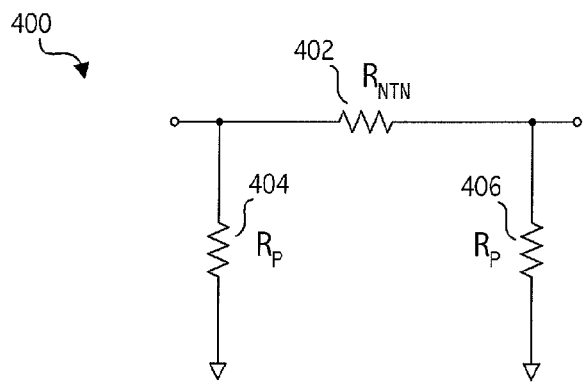
FIG. 4 illustrates a circuit diagram of an exemplary resistor structure consistent with at least one embodiment of the invention.

Referring to FIGS. 3 and 4, in at least one embodiment of oscillator circuit 200, a passive circuit coupled to $C_{LOAD}$ includes a temperature compensation resistor (e.g., $R_{TC}$) at least partially formed from a non-n-well, non-p-well (i.e., NTN) bulk material. For example, a resistor is formed from NTN bulk material (e.g., NTN bulk material resistor portion 314) by including two p-well terminals (e.g., p-well resistor terminal 312 and p-well resistor terminal 316). An exemplary NTN bulk material has a doping (i.e., an acceptor concentration, $N_a$) of approximately $1.35 \times 10^{15}$ atoms/cm$^3$ and a resistor formed from the NTN bulk material has a temperature sensitivity, S(R,T), of approximately +6400 ppm/° C. Note that in at least one embodiment, resistor portion 314 is not electrically isolated. Accordingly, the NTN bulk material resistor portion is modeled with parasitic resistors 404 and 406, each having a resistance $R_P$. In at least one embodiment of an LC oscillator circuit, the NTN bulk material region is formed underneath the inductor circuit since the high resistivity of the NTN bulk material results in smaller power losses and Q reduction due to eddy currents generated in material(s) beneath the inductor in an oscillator circuit.

Figure 5:
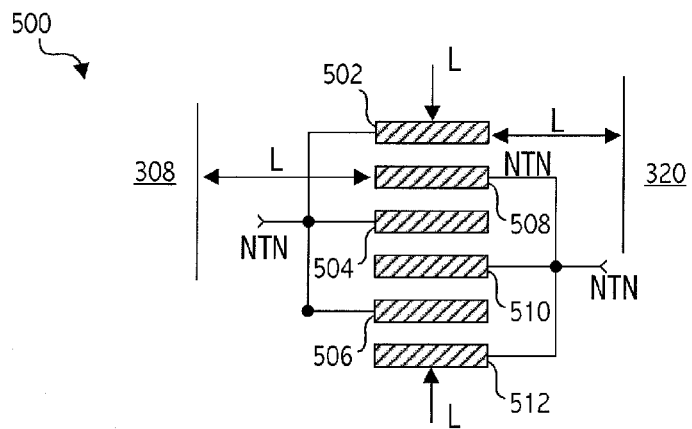
FIG. 5 illustrates a layout of an exemplary resistor structure consistent with at least one embodiment of the invention.

In at least one embodiment of an NTN bulk material resistor portion, the ratio of $R_P$ to $R_{NTN}$ (i.e., $R_P/R_{NTN}$) is large enough to reduce possible common-mode coupling of ground noise into the circuit. Referring to FIGS. 3 and 5, exemplary layout techniques reduce common mode coupling of ground noise into the oscillator circuit. For example, p-well resistor terminals 312 and 316 may each be formed by a plurality of p-well resistor contact fingers (e.g., p-well resistor contact fingers 502, 504, and 506, and p-well resistor contact fingers 508, 510, and 512, respectively). In addition, the p-well resistor terminals may be formed a sufficiently large distance (L) from other nearby p-well structures (e.g., p-well 308 and p-well 320).

Figure 6:
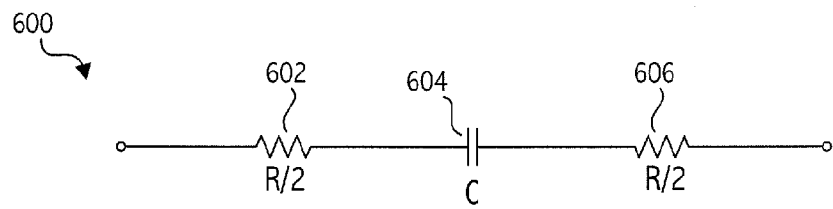
FIG. 6 illustrates a circuit diagram of an exemplary passive circuit structure consistent with at least one embodiment of the invention.
Figure 7:
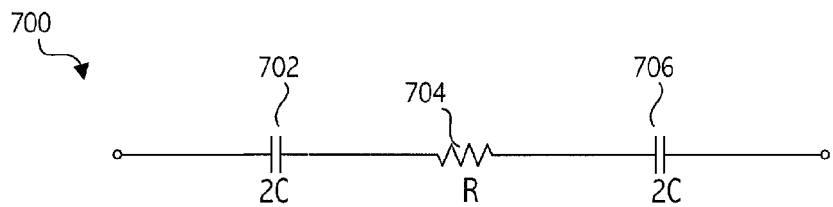
FIG. 7 illustrates a circuit diagram of an exemplary passive circuit structure consistent with at least one embodiment of the invention.

Referring to FIGS. 2, 6, and 7, in at least some embodiments, passive circuit 202 is symmetric, thereby improving the power-supply rejection ratio (i.e., PSRR) as compared to asymmetric passive circuits. However, note that techniques described herein are applicable to both symmetric and asymmetric passive circuits. Although either passive circuit configuration 600 or passive circuit configuration 700 may be used for passive circuits including metal resistors, passive circuits including NTN bulk material resistor portions may be easier to implement using passive circuit configuration 700.

Figure 8:
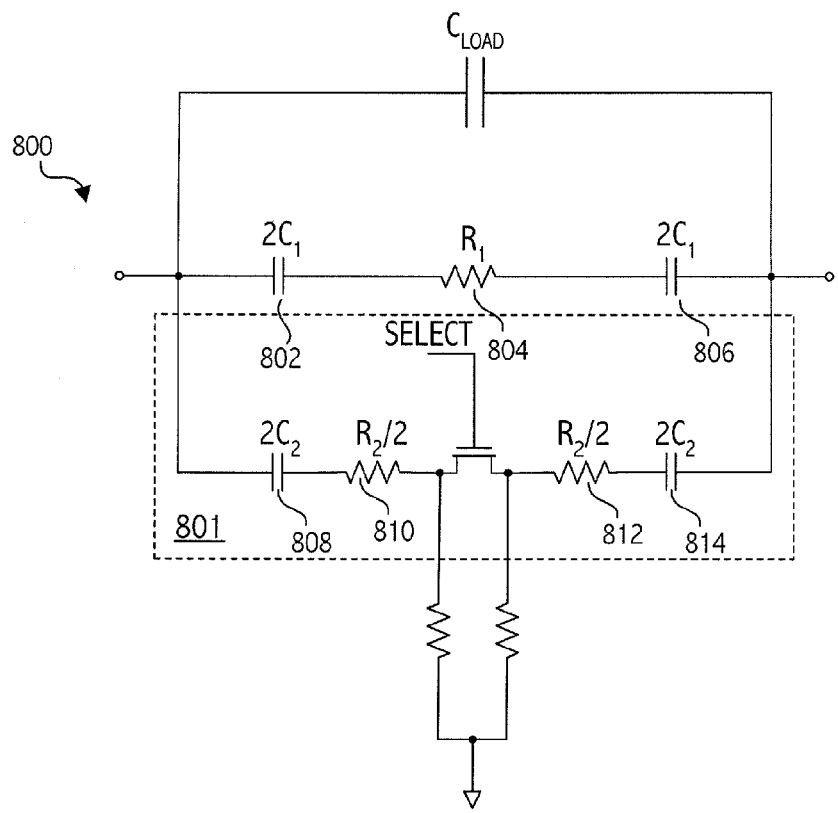
FIG. 8 illustrates a circuit diagram of an exemplary passive circuit structure consistent with at least one embodiment of the invention.

Referring to FIG. 8, in at least one embodiment of oscillator circuit 200, passive circuit 202 includes one or more additional passive circuit branches (e.g., passive circuit branch 802) that are configured to be selectively coupled to the load capacitor of the oscillator circuit. Although the additional passive circuit branches of FIG. 8 are illustrated as being symmetric, other circuit configurations may be used. The additional branches may be used to implement a programmable range of temperature sensitivity of the passive circuit. A control circuit (not shown) coupled to the oscillator circuit may provide control signals for selectively enabling one or more of the additional branches according to a suitable criteria. For example, an oscillator circuit may be calibrated for operation at a particular frequency. Later operations may indicate that the oscillator circuit performs at a different frequency as a result of a substantial temperature sensitivity. Accordingly, one or more additional passive circuit branches may be selectively enabled to reduce the temperature sensitivity of the oscillator circuit. In at least one embodiment of an oscillator circuit, a one-time calibration after power-up of the oscillator circuit is performed, and passive circuit branches are selectively enabled accordingly.

Referring back to FIG. 2, in at least one embodiment of oscillator circuit 200, the passive circuit includes a temperature compensation resistor (e.g., $R_{TC}$) at least partially formed from copper, which has a temperature sensitivity, S($R_{TC}$,T), of approximately +3200 ppm/° C. However, since the sheet resistance of copper is low, a large area of copper may be needed to form a suitable temperature compensation resistance, thereby impacting the Q associated with the passive circuit. Note that other embodiments of oscillator circuit 200 include a temperature compensation resistor portion formed from one or more other metals or other materials having suitable temperature sensitivity.

Exemplary computations for S($C_{EFF}$,T), and Q for exemplary values of α and S($R_{TC}$,T) corresponding to an exemplary copper resistor (e.g., S($R_{TC}$,T)=+3200 ppm/° C.) and an exemplary NTN resistor (e.g., S($R_{TC}$,T)=+6400 ppm/° C.) are as follows:

TABLE 1

S($C_{EFF}$, T) and Q for Exemplary Values of α and S($R_{TC}$, T)

| | S($R_{TC}$, T) = +3200 ppm/° C. | | S($R_{TC}$, T) = +6400 ppm/° C. | |
| --- | --- | --- | --- | --- |
| α | S($C_{EFF}$, T) | Q | S($C_{EFF}$, T) | Q |
| 5% | −78 ppm/° C. | 40.6 | −156 ppm/° C. | 40.6 |
| 2.5% | −39 ppm/° C. | 80 | −79 ppm/° C. | 80 |
| 1.5% | −20 ppm/° C. | 155 | −40 ppm/° C. | 155 |

Figure 9:
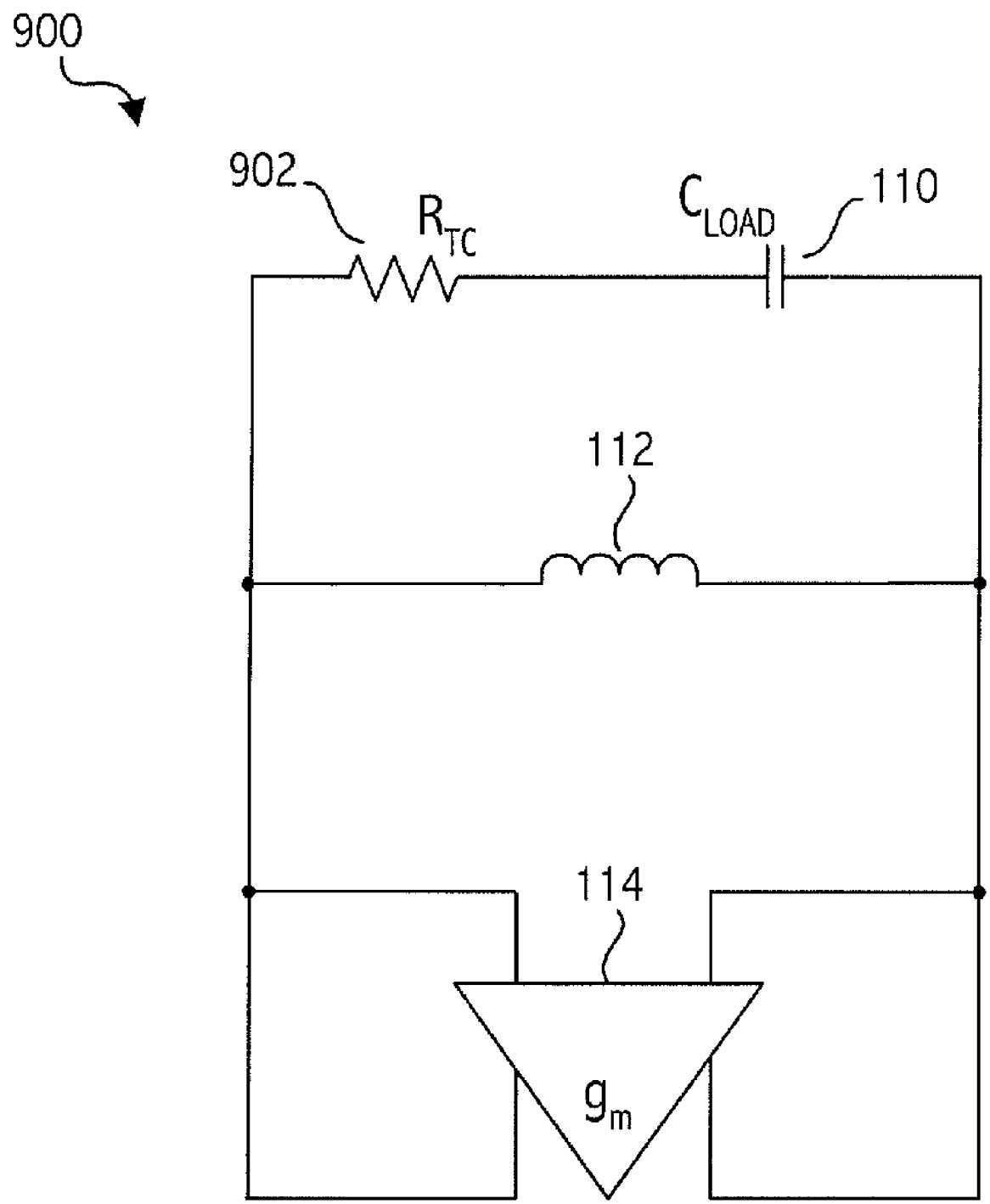
FIG. 9 illustrates a circuit diagram of an exemplary oscillator circuit consistent with at least one embodiment of the invention.

Referring to FIG. 9, introducing or increasing a resistance (e.g., temperature compensation resistor 902) in the main $C_{LOAD}$ branch also results in a $C_{EFF}$ with a negative temperature sensitivity (i.e., S($C_{EFF}$, T)). The values of S($C_{EFF}$, T) achieved with the circuit configuration of oscillator circuit 900 are proportional to $R_{TC}^2$, and remain small until $R_{TC}$ is substantially large. Although this circuit configuration may be suitable for some applications, the substantially large value of $R_{TC}$ corresponds to a substantial reduction in Q. Therefore this technique may be impractical for high-performance LC oscillator circuits. For example, to obtain a −40 ppm/° C. temperature sensitivity change in $C_{EFF}$ that is sufficient to drive a +20 ppm/° C. change in $f_{osc}$, the configuration of oscillator circuit 900 including a resistor in series with $C_{LOAD}$ has a Q of approximately 12.7, a configuration of oscillator circuit 200 including a copper resistor in parallel with $C_{LOAD}$ has a Q of 80, and a configuration of oscillator circuit 200 including an NTN resistor in parallel with $C_{LOAD}$ has a Q of 155.

TABLE 2

S($C_{EFF}$, T) and Q for $R_{TC}$ in series with $C_{LOAD}$

| $R_C$ | Q | S($C_{EFF}$, T) |
| --- | --- | --- |
| 1.05 Ohms | 40 | −4 ppm/° C. |

TABLE 2-continued

S($C_{EFF}$, T) and Q for $R_{TC}$ in series with $C_{LOAD}$

| $R_C$ | Q | S($C_{EFF}$, T) |
|---|---|---|
| 2.1 Ohms | 20 | −16 ppm/° C. |
| 4.2 Ohms | 10.1 | −64 ppm/° C. |

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, while the invention has been described in an embodiment in which particular RC passive circuit configurations are illustrated, one of skill in the art will appreciate that the teachings herein can be utilized with other configurations and combinations of passive circuit elements. In addition, note that embodiments of oscillator circuit 200 and passive circuit 202 may be used in conjunction with a suitable digital temperature compensation technique (not shown), thereby reducing a range of temperature sensitivity compensation required from the digital temperature compensation technique and reducing noise introduced by the digital temperature compensation. Variations and modifications of the embodiments disclosed herein, may be made based on the description set forth herein, without departing from the scope and spirit of the invention as set forth in the following claims.

What is claimed is:

1. An oscillator circuit configured to generate a periodic signal having a free-running frequency comprising:
a first circuit portion including at least one inductor coupled in parallel with at least one load capacitor, the first circuit portion having an inductance-capacitance product that has a first temperature sensitivity; and
a passive circuit portion coupled in parallel with the first circuit portion, the passive circuit portion including at least one resistor in series with at least one capacitor,
wherein the passive circuit portion has a second temperature sensitivity that opposes an effect of the first temperature sensitivity on the free-running frequency of the oscillator circuit, thereby reducing temperature sensitivity of the free-running frequency,
wherein a temperature sensitivity of an effective capacitance (S($C_{EFF}$, T)) of the oscillator circuit is equal to $$-\frac{\alpha}{2} S(R_{TC}, T),$$

where α<<1 and S($R_{TC}$,T) is a temperature sensitivity of the at least one resistor.

2. The oscillator circuit as recited in claim 1, wherein the passive circuit portion has a capacitance substantially less than a load capacitance of the first circuit portion.

3. The oscillator circuit as recited in claim 2, wherein a ratio of the capacitance of the passive circuit portion to the load capacitance of the first circuit portion is approximately 10% or less.

4. The oscillator circuit as recited in claim 1, wherein the at least one resistor of the passive circuit portion comprises a non-n-well, non-p-well (NTN) bulk material resistor portion.

5. The oscillator circuit as recited in claim 4, wherein the at least one resistor of the passive circuit portion comprises a plurality of interdigitated contact regions having a doping greater than the NTN bulk material resistor portion and being coupled to the NTN bulk material resistor portion.

6. The oscillator circuit as recited in claim 4, wherein the NTN bulk material resistor portion is not electrically isolated and the resistance of the at least one resistor is substantially greater than a parasitic resistance between the NTN bulk material resistor portion and a power supply terminal coupled to an NTN bulk material region including the NTN bulk material resistor portion.

7. The oscillator circuit as recited in claim 1, wherein the at least one resistor of the passive circuit portion comprises a metal resistor portion.

8. The oscillator circuit as recited in claim 1, further comprising:
a second passive circuit portion selectively coupled in parallel with the passive circuit portion and with the first circuit portion.

9. A method for generating a periodic signal having a free-running frequency comprising:
passively opposing a first temperature sensitivity of an inductance-capacitance product of an oscillator circuit including at least one inductor coupled in parallel with at least one load capacitor, thereby reducing temperature sensitivity of the free-running frequency of the oscillator circuit,
wherein the passively opposing is performed by a passive circuit portion including at least one resistor in series with at least one capacitor and having a second temperature sensitivity,
wherein a temperature sensitivity of an effective capacitance (S($C_{EFF}$, T)) of the oscillator circuit is equal to $$-\frac{\alpha}{2} S(R_{TC}, T),$$

where α<<1 and S($R_{TC}$,T) is a temperature sensitivity of the at least one resistor.

10. The method as recited in claim 9, wherein the resistance of the passive circuit portion increases by at least approximately 1500 parts-per-million per degree Celsius (1500 ppm/° C.).

11. The method as recited in claim 9, wherein the resistance of the passive circuit portion increases by at least approximately 6000 parts-per-million per degree Celsius (6000 ppm/° C.).

12. The method as recited in claim 9, wherein the passively opposing is programmable and comprises:
selectively increasing the passive opposition to the temperature sensitivity of an inductance-capacitance product of an oscillator circuit, thereby further reducing an effect of temperature variation on the free-running frequency of the oscillator circuit.

13. The method as recited in claim 9, wherein the at least one resistor of the passive circuit portion comprises a non-n-well, non-p-well (NTN) bulk material resistor portion.

14. An oscillator circuit configured to generate a periodic signal having a free-running frequency comprising:
- a first circuit portion including at least one inductor coupled in parallel with at least one load capacitor, the first circuit portion having an inductance-capacitance product that has a first temperature sensitivity; and
- a passive circuit portion coupled in parallel with the first circuit portion, the passive circuit portion including at least one resistor in series with at least one capacitor,
- wherein the passive circuit portion has a second temperature sensitivity that opposes an effect of the first temperature sensitivity on the free-running frequency of the oscillator circuit, thereby reducing temperature sensitivity of the free-running frequency,
- wherein a resistance of the at least one resistor ($R_{TC}$) and a capacitance of the at least one capacitor ($C_{TC}$) have a product ($R_{TC} \times C_{TC}$) approximately equal to a square root of the inductance-capacitance product ($\sqrt{LC_{LOAD}}$.

15. The oscillator circuit as recited in claim 14, wherein a temperature sensitivity of an effective capacitance ($S(C_{EFF}, T)$) of the oscillator circuit is equal to $$-\frac{\alpha}{2} S(R_{TC}, T),$$

where $\alpha \ll 1$ and $S(R_{TC}, T)$ is a temperature sensitivity of the at least one resistor.

16. The oscillator circuit as recited in claim 14, wherein the passive circuit portion has a capacitance substantially less than a load capacitance of the first circuit portion.

17. The oscillator circuit as recited in claim 16, wherein a ratio of the capacitance of the passive circuit portion to the load capacitance of the first circuit portion is approximately 10% or less.

18. The oscillator circuit as recited in claim 14, wherein the at least one resistor of the passive circuit portion comprises forming the at least one resistor from a non-n-well, non-p-well (NTN) bulk material resistor portion.

19. The oscillator circuit as recited in claim 18, wherein the at least one resistor of the passive circuit portion comprises forming a plurality of interdigitated contact regions having a doping greater than the NTN bulk material resistor portion and being coupled to the NTN bulk material resistor portion.

20. The oscillator circuit as recited in claim 18, wherein the NTN bulk material resistor portion is not electrically isolated and the resistance of the at least one resistor is substantially greater than a parasitic resistance between the NTN bulk material resistor portion and a power supply terminal coupled to an NTN bulk material region including the NTN bulk material resistor portion.

21. The oscillator circuit as recited in claim 14, wherein the at least one resistor of the passive circuit portion comprises a metal resistor portion.

22. The oscillator circuit as recited in claim 14, further comprising:
- a second passive circuit portion selectively coupled in parallel with the passive circuit portion and with the first circuit portion.

23. A method for generating a periodic signal having a free-running frequency comprising:
- passively opposing a first temperature sensitivity of an inductance-capacitance product of an oscillator circuit including at least one inductor coupled in parallel with at least one load capacitor, thereby reducing temperature sensitivity of the free-running frequency of the oscillator circuit,
- wherein the passively opposing is performed by a passive circuit portion including at least one resistor in series with at least one capacitor and having a second temperature sensitivity,
- wherein a resistance of the at least one resistor ($R_{TC}$) and a capacitance of the at least one capacitor ($C_{TC}$) have a product ($R_{TC} \times C_{TC}$) approximately equal to a square root of the inductance-capacitance product ($\sqrt{LC_{LOAD}}$.

24. The method as recited in claim 23, wherein a temperature sensitivity of an effective capacitance ($S(C_{EFF}, T)$) of the oscillator circuit is equal to $$-\frac{\alpha}{2} S(R_{TC}, T),$$

where $\alpha \ll 1$ and $S(R_{TC}, T)$ is a temperature sensitivity of the at least one resistor.

25. The method as recited in claim 23, wherein the resistance of the passive circuit portion increases by at least approximately 1500 parts-per-million per degree Celsius (1500 ppm/° C.).

26. The method as recited in claim 23, wherein the resistance of the passive circuit portion increases by at least approximately 6000 parts-per-million per degree Celsius (6000 ppm/° C.).

27. The method as recited in claim 23, wherein the passively opposing is programmable and comprises:
- selectively increasing the passive opposition to the temperature sensitivity of an inductance-capacitance product of an oscillator circuit, thereby further reducing an effect of temperature variation on the free-running frequency of the oscillator circuit.

28. The method as recited in claim 23, wherein the at least one resistor of the passive circuit portion comprises a non-n-well, non-p-well (NTN) bulk material resistor portion.

* * * * *

UNITED STATES PATENT AND TRADEMARK OFFICE
CERTIFICATE OF CORRECTION

PATENT NO. : 7,777,585 B1 Page 1 of 1
APPLICATION NO. : 12/145647
DATED : August 17, 2010
INVENTOR(S) : Jeffrey L. Sonntag It is certified that error appears in the above-identified patent and that said Letters Patent is hereby corrected as shown below:

In claim 14, column 9, line 21, please replace "$(\sqrt{\overline{LC_{LOAD}}} \cdot$ " with -- $(\sqrt{LC_{LOAD}}) \cdot$ --;

In claim 23, column 10, line 24, please replace "$(\sqrt{\overline{LC_{LOAD}}} \cdot$ " with -- $(\sqrt{LC_{LOAD}}) \cdot$ --;

In claim 25, column 10, line 38, please replace "C.)." with --C).--;

In claim 26, column 10, line 42, please replace "C.)." with --C).--.

Signed and Sealed this

Second Day of November, 2010

David J. Kappos
*Director of the United States Patent and Trademark Office*